(12) United States Patent
Ino

(10) Patent No.: US 7,875,925 B2
(45) Date of Patent: Jan. 25, 2011

(54) NONVOLATILE SEMICONDUCTOR MEMORY DEVICE

(75) Inventor: Tsunehiro Ino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 354 days.

(21) Appl. No.: 12/193,251

(22) Filed: Aug. 18, 2008

(65) Prior Publication Data

US 2009/0057753 A1   Mar. 5, 2009

(30) Foreign Application Priority Data

Aug. 28, 2007   (JP) ............................. 2007-221698

(51) Int. Cl.
*H01L 29/792* (2006.01)
(52) U.S. Cl. .................. 257/324; 257/315; 257/321; 257/325; 257/E21.21; 257/E29.309
(58) Field of Classification Search .................. None
See application file for complete search history.

(56) References Cited

U.S. PATENT DOCUMENTS

| 7,655,971 | B2 * | 2/2010 | Ino et al. .................. 257/325 |
| 2008/0116507 | A1 | 5/2008 | Ino et al. |

FOREIGN PATENT DOCUMENTS

| JP | 2006-203200 | 8/2006 |
| JP | 2004-363329 | 12/2008 |

OTHER PUBLICATIONS

U.S. Appl. No. 11/966,304, filed Dec. 28, 2007, Tsunehiro Ino, et al.
Masao Mizuno, et al, "Phase Diagram of the System $Al_2O_3$-$La_2O_3$ at Elevated Temperature", The Ceramic Society of Japan, 82 [12], 1974, pp. 631-636.

(Continued)

*Primary Examiner*—Evan Pert
*Assistant Examiner*—Scott Wilson
(74) *Attorney, Agent, or Firm*—Oblon, Spivak, McClelland, Maier & Neustadt, L.L.P.

(57) ABSTRACT

A nonvolatile semiconductor memory device includes a source region and a drain region spaced from each other in a surface of a semiconductor layer, a tunnel insulating film provided on the semiconductor layer between the source region and the drain region, a charge storage film provided on the tunnel insulating film, a block insulating film provided on the charge storage film, and a control gate electrode provided on the block insulating film. The block insulating film is made of $(Rm_{1-x}Ln_x)_{2-y}Al_yO_{3+\delta}$, where Ln is one or more selected from Pr, Tb, Ce, Yb, Eu, and Sm, Rm is one or more selected from La, Nd, Gd, Dy, Ho, Er, Tm, Lu, Y, and Sc, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb).

21 Claims, 8 Drawing Sheets

OTHER PUBLICATIONS

L.M. Holmes, et al., "Magnetic Behavior of Metamagnetic $DyAlO_3$", Physical Review B, vol. 5, No. 1, Jan. 1972, pp. 138-146.

Xusheng Wang, et al."Synthesis and Electric Property of $CeAlO_3$ Ceramics", Japanese Journal of Applied Physics, vol. 44, No. 2, 2005, pp. 961-963.

U.S. Appl. No. 12/234,197, filed Sep. 19, 2008, Shingu, et al.

Masami Sekita, et al. "Strong $Tb^{3+}$ Emission of $TbAlO_3$ at Room Temperature", American Institute of Physics, Appl. Phys. Lett. 65 (19), Nov. 7, 1994, pp. 2380-2382.

* cited by examiner

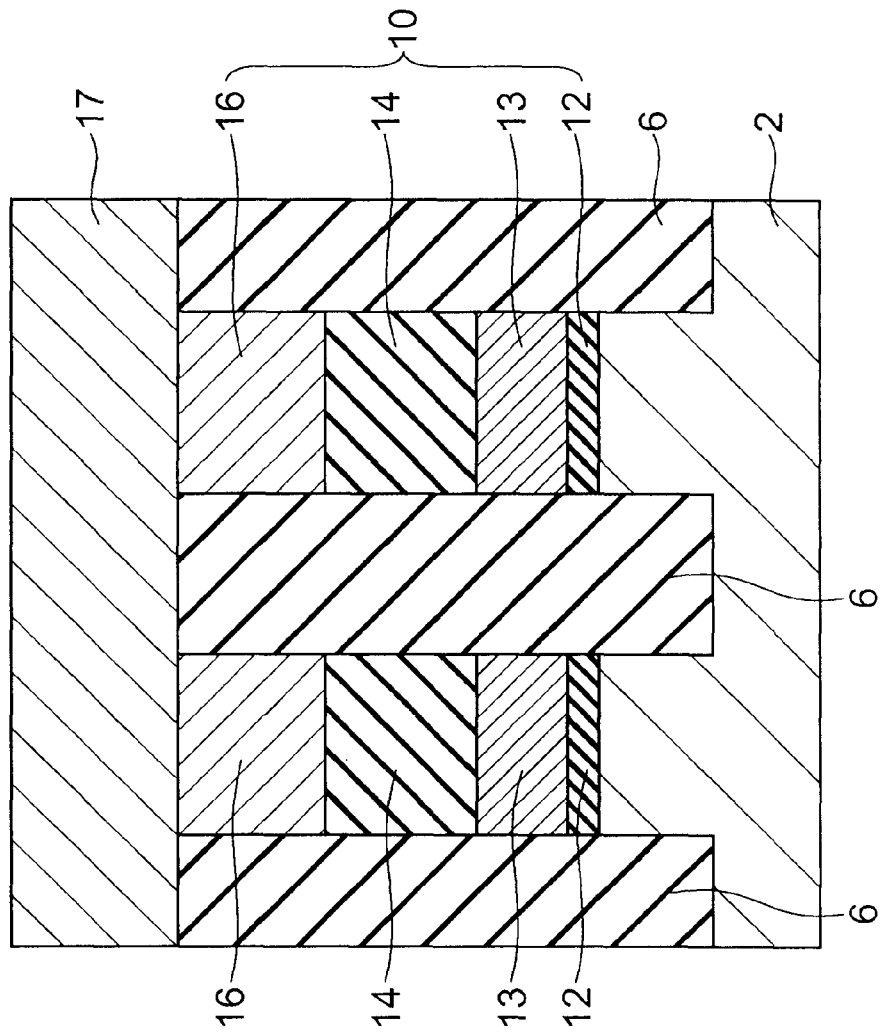
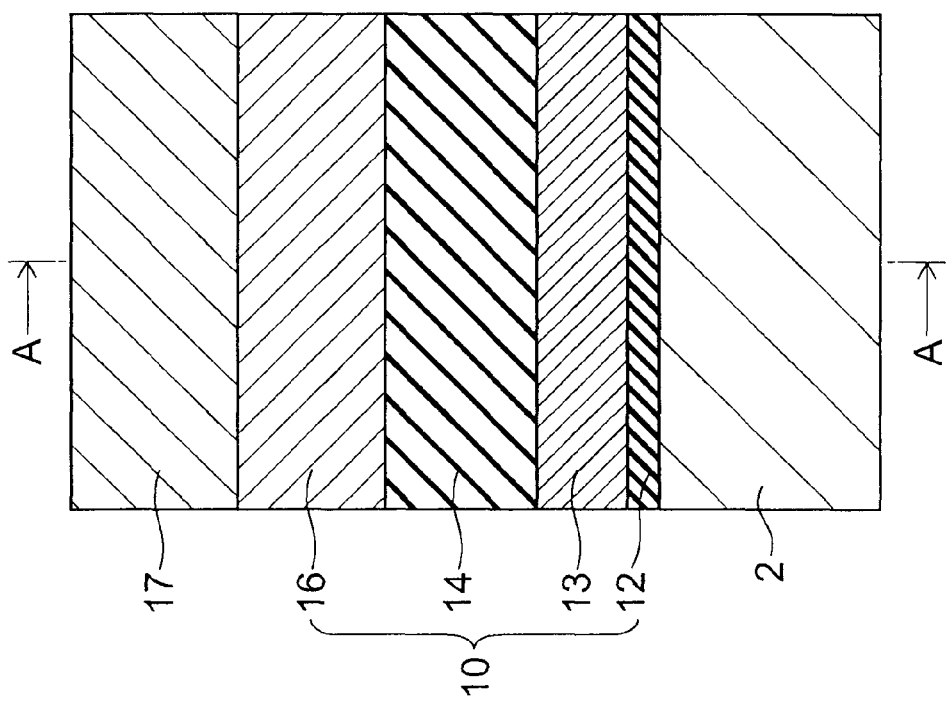
FIG. 8A
FIG. 8B

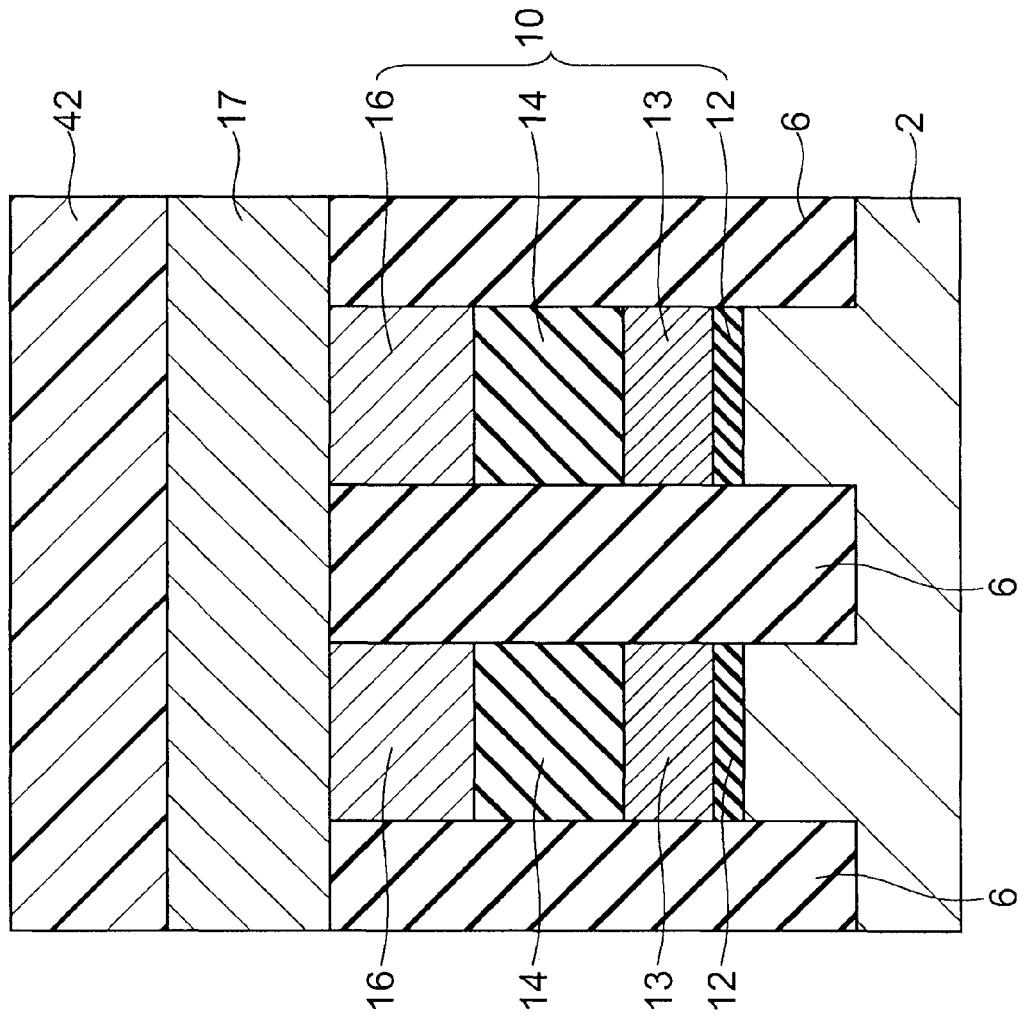
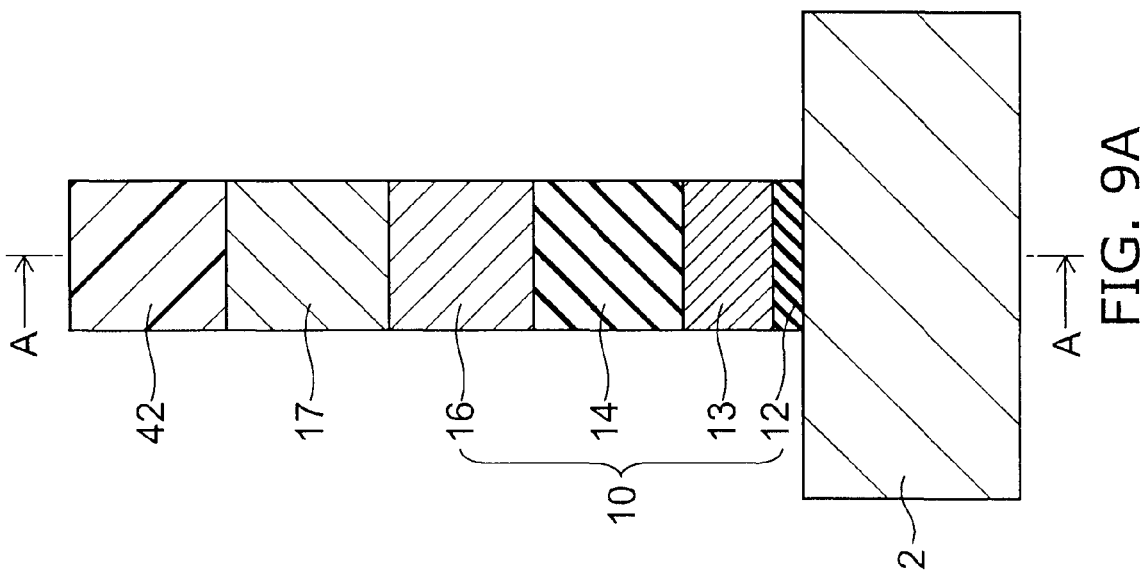
FIG. 9B
FIG. 9A

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2007-221698, filed on Aug. 28, 2007; the entire contents of which are incorporated herein by reference.

BACKGROUND OF THE INVENTION

1. Field of the Invention

This invention relates to a nonvolatile semiconductor memory device including a block insulating film and a charge storage portion.

2. Background Art

There are numerous types of memory devices that are nonvolatile even during power-down if those in the research phase are included. Currently, however, nonvolatile semiconductor memory devices (flash memories) have the largest market size. Semiconductor circuits are being downscaled year by year, and semiconductor memory devices are also increasing in capacity. With regard to flash memories, which are no exception and being downscaled, application of a structure including a block insulating film and a charge storage portion, such as the MONOS (metal-oxide-nitride-oxide-silicon) structure, is under study. JP-A 2006-203200 (Kokai) discloses a technique for using an oxide containing a rare earth element and aluminum as a tunnel insulating film or a block insulating film.

SUMMARY OF THE INVENTION

According to an aspect of the invention, there is provided a nonvolatile semiconductor memory device including: a source region and a drain region spaced from each other in a surface of a semiconductor layer; a tunnel insulating film provided on the semiconductor layer between the source region and the drain region; a charge storage film provided on the tunnel insulating film; a block insulating film provided on the charge storage film and made of $(Rm_{1-x}Ln_x)_{2-y}Al_yO_3+\delta$, where Ln is one or more selected from Pr, Tb, Ce, Yb, Eu, and Sm, Rm is one or more selected from La, Nd, Gd, Dy, Ho, Er, Tm, Lu, Y, and Sc, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb); and a control gate electrode provided on the block insulating film.

According to another aspect of the invention, there is provided a nonvolatile semiconductor memory device including: a source region and a drain region spaced from each other in a surface of a semiconductor layer; a tunnel insulating film provided on the semiconductor layer between the source region and the drain region; a charge storage film provided on the tunnel insulating film and made of $Lm_{2-z}Al_zO_3+\epsilon$, where Lm is one or more selected from Pr, Tb, Ce, Yb, Eu, and Sm, $0.95 \leq z \leq 1.20$, and $0 \leq \epsilon \leq (2-z)/2$ (but $-(2-z)/2 \leq \epsilon \leq 0$ if Lm is Yb, Eu, and Sm, $0 \leq \epsilon \leq (2-z)/3$ if Lm is Pr, and $0 \leq \epsilon \leq 3(2-z)/14$ if Lm is Tb); a block insulating film provided on the charge storage film; and a control gate electrode provided on the block insulating film.

BRIEF DESCRIPTION OF THE DRAWINGS

FIGS. 4 to 9B are process cross-sectional views illustrating a method for manufacturing the nonvolatile semiconductor memory device of the embodiment.

DETAILED DESCRIPTION OF THE INVENTION

Embodiments of the invention will now be described with reference to the drawings.

First Embodiment

Figure 1:
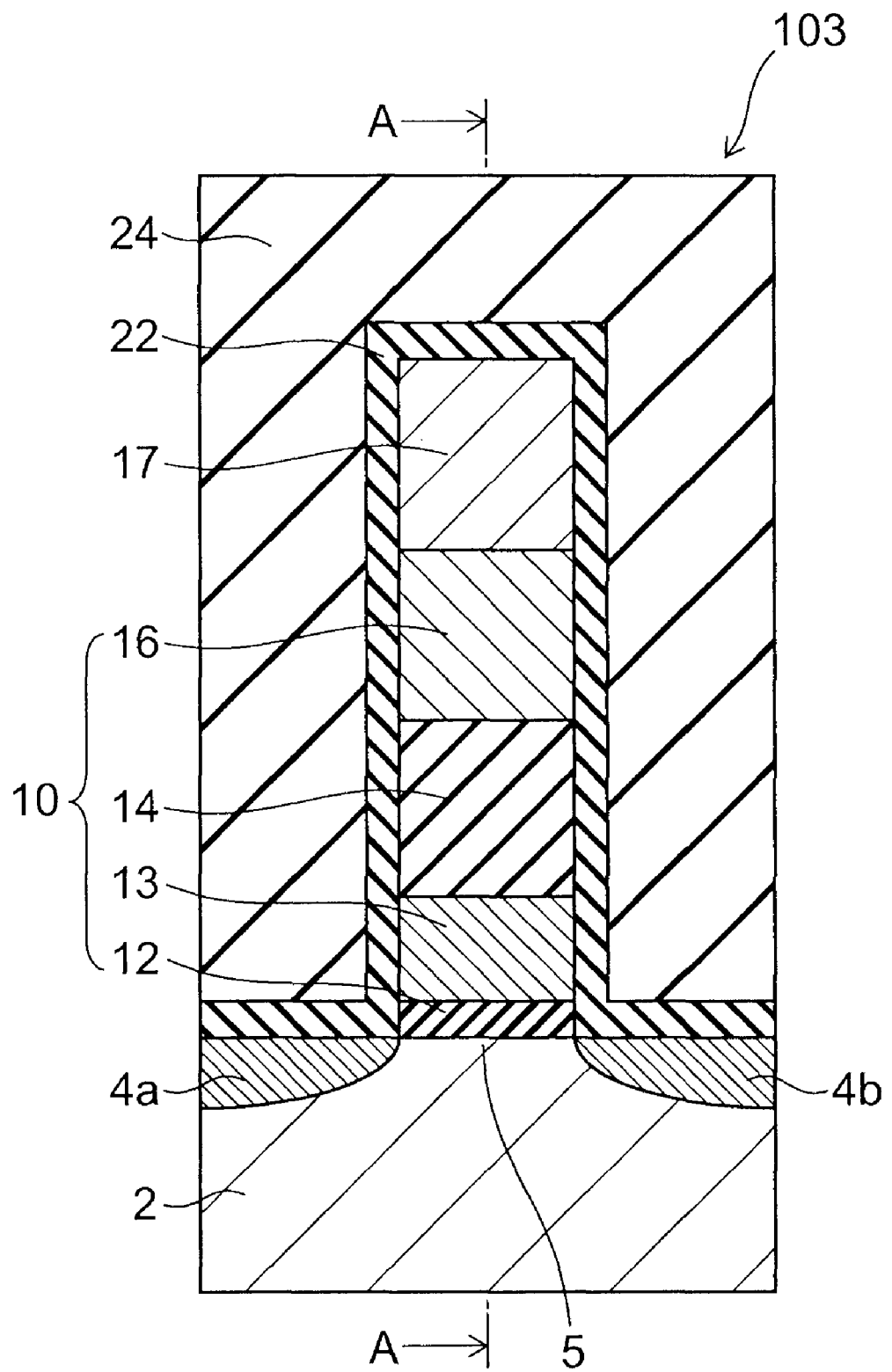
FIG. 1 is a cross-sectional schematic view of a nonvolatile semiconductor memory device according to a first embodiment of the invention.

FIG. 1 is a cross-sectional schematic view of a nonvolatile semiconductor memory device according to a first embodiment of the invention.

Figure 2:
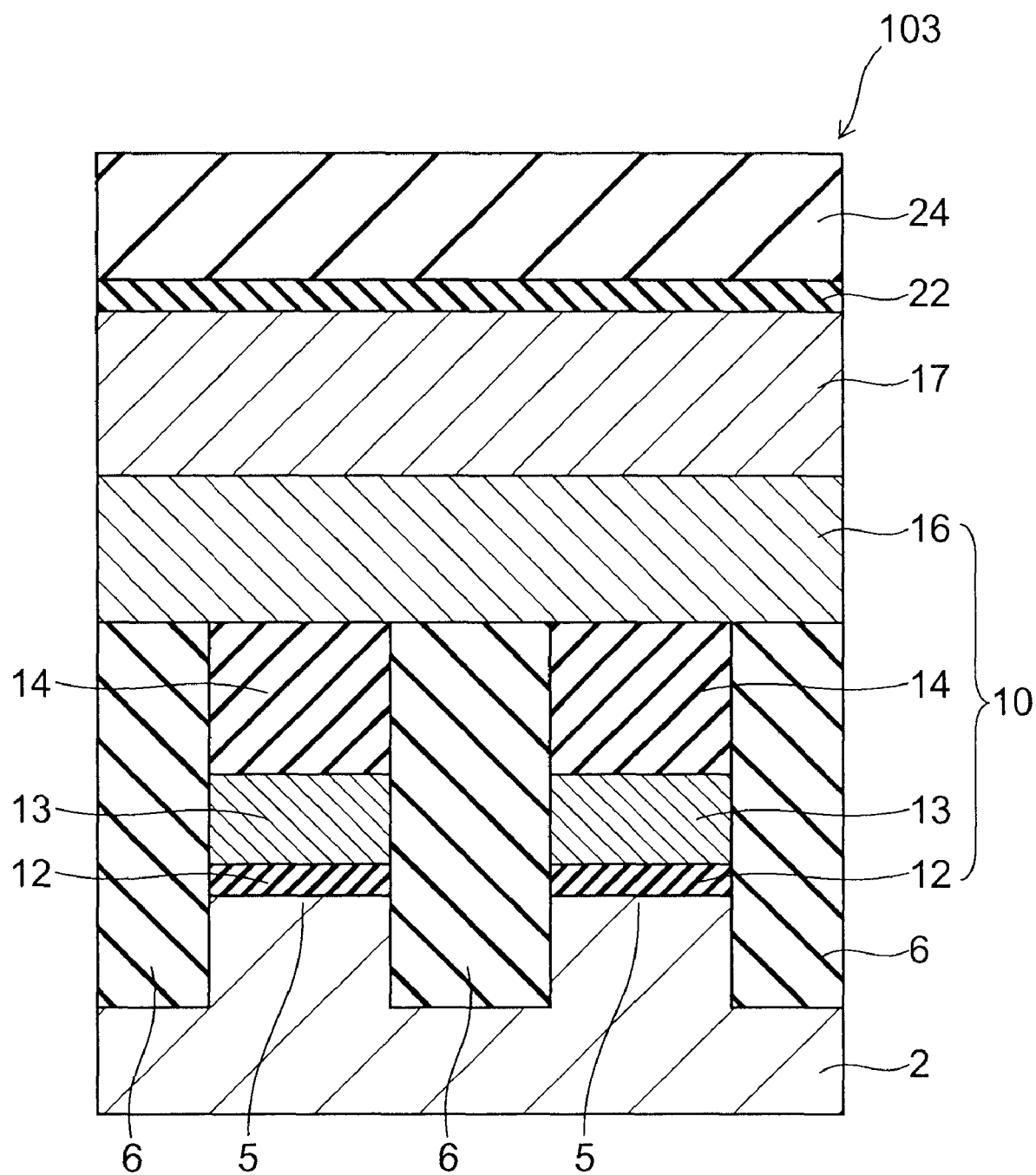
FIG. 2 is a cross-sectional view taken along line A-A of FIG. 1.

FIG. 2 is a cross-sectional view taken along line A-A of FIG. 1.

Figure 3:
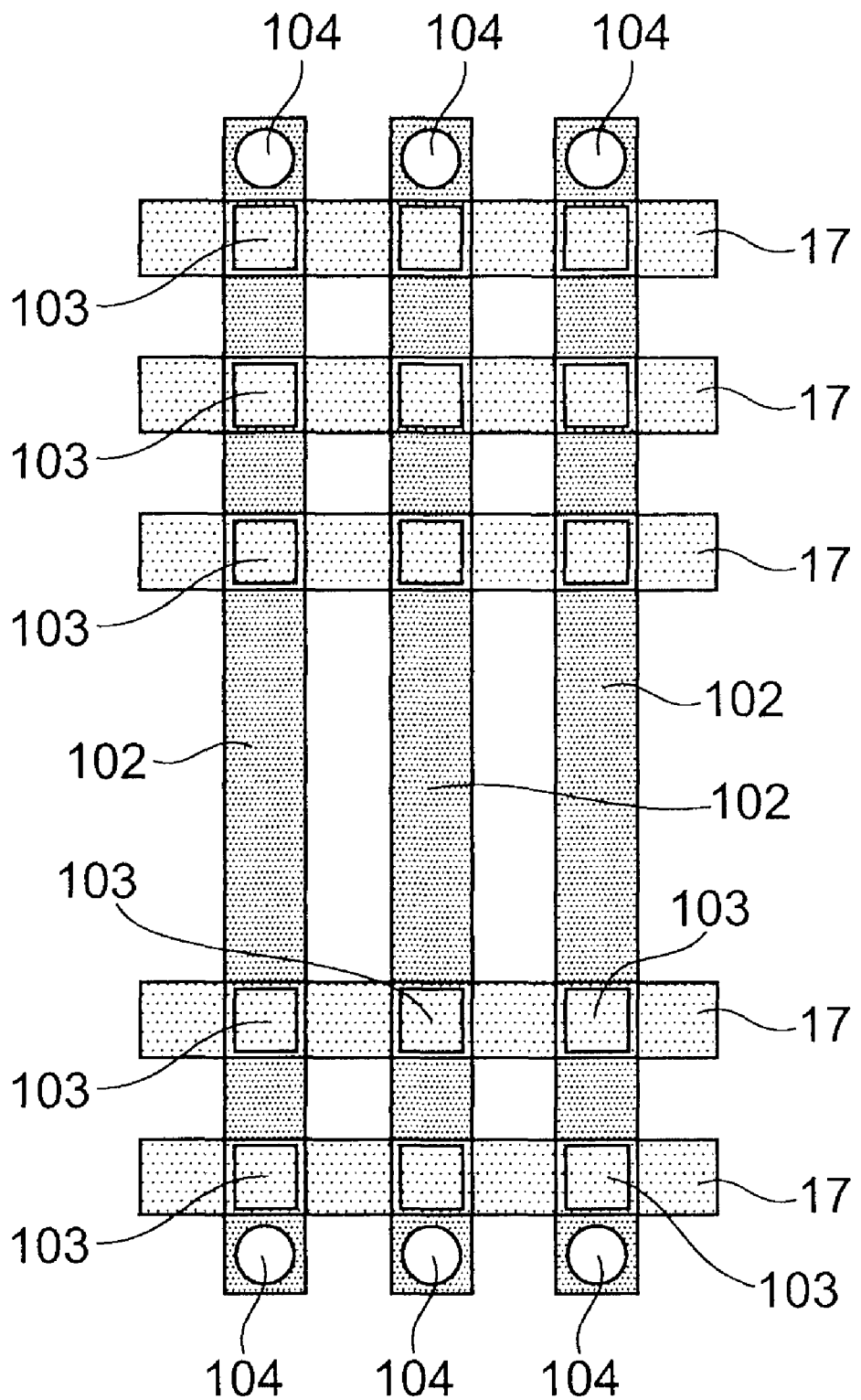
FIG. 3 is a schematic plan view illustrating the layout of the main configuration of the nonvolatile semiconductor memory device of the embodiment.

FIG. 3 is a schematic plan view illustrating the layout of the main configuration of the nonvolatile semiconductor memory device of this embodiment.

This nonvolatile semiconductor memory device is a NAND flash memory including memory cells of the MONOS (metal-oxide-nitride-oxide-semiconductor) structure. This embodiment is based on a planar cell structure in which each memory cell is separated by an insulating film such as a silicon oxide film, which preferably has a low dielectric constant, so that the downscaling of memory cells does not increase interference between adjacent memory cells.

In the nonvolatile semiconductor memory device of this embodiment, as illustrated in FIG. 3, word lines 17 and bit lines 102 are wired in a matrix configuration, and a memory cell 103 is placed at each intersection thereof. Furthermore, the word lines 17 and bit lines 102 are suitably provided with contacts 104 and electrically connected to overlying or underlying elements.

The memory cell 103 is NAND-connected. Each memory cell 103 comprises a source region 4a and a drain region 4b opposed to and spaced from each other in the surface of a semiconductor layer 2 (or well), a semiconductor region serving as a channel 5 provided between the source region 4a and the drain region 4b, and a gate 10 formed on this semiconductor region and having a stacked structure.

The gate 10 has a structure in which a tunnel insulating film 12, a rare earth aluminate film (charge storage film) 13 with the rare earth element being potentially tetravalent or divalent, a lanthanum aluminate film (block insulating film) 14 added with a potentially tetravalent or divalent rare earth element, and a control gate electrode film 16 are sequentially laminated.

The word line 17 is provided so as to be connected to the control gate electrode film 16 of the NAND-connected memory cell 103. In each memory cell 103, the side surface of the gate 10 and the upper and side surface of the word line 17 are covered with an insulating film 22. As shown in FIG. 2, the gate 10 of the NAND-connected memory cell 103 is separated by an insulating film 6. Each memory cell 103 is covered with an interlayer insulating film 24. It is noted that FIG. 2 is a cross-sectional view taken along the row direction, that is, the extending direction of the word line 17, and FIG. 1 is a cross-sectional view taken along the column direction, which is orthogonal to the row direction.

According to this embodiment, the charge storage film 13 is made of an aluminate of a potentially tetravalent or divalent rare earth element. More specifically, the charge storage film 13 is made of $Lm_{2-z}Al_zO_{3+\in}$ (where Lm is one or more of Pr, Tb, Ce, Yb, Eu, and Sm, $0.95 \leq z \leq 1.20$, and $0 \leq \in \leq (2-z)/2$ (but $-(2-z)/2 \leq \in \leq 0$ if Lm is Yb, Eu, and Sm, $0 \leq \in \leq (2-z)/3$ if Lm is Pr, and $0 \leq \in \leq 3(2-z)/14$ if Lm is Tb). This can maximize the charge trapping efficiency, achieving good charge storage effect and good retention characteristics.

On the other hand, according to this embodiment, the block insulating film 14 is made of lanthanum aluminate added with a potentially tetravalent or divalent rare earth element to allow reduction of leakage current and achieve good insulation characteristics. More specifically, the block insulating film 14 is made of $(La_{1-x}Ln_x)_{2-y}Al_yO_{3+\delta}$ (where Ln is one or more of Pr, Tb, Ce, Yb, Eu, and Sm, $0 < x < 0.167$ (but $0 < x < 0.333$ if Ln is Pr, and $0 < x < 0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb)). However, as described later in detail, La can be replaced by one or more elements of Nd, Gd, Dy, Ho, Er, Tm, Lu, Y, and Sc.

In the case of using a potentially tetravalent rare earth element, it traps an electron and transitions to the trivalent state, and this electron capture mechanism provides a substantial scattering cross section. As a result, the location of the potentially tetravalent rare earth element added serves as a designed trap site. On the other hand, in the case of using a potentially divalent rare earth element, the element in the trivalent state traps an electron and transitions to the divalent state, and this electron capture mechanism likewise provides a substantial scattering cross section. As a result, the location of the potentially divalent rare earth element added serves as a designed trap site.

In conventional $SiN_x$ charge storage films, the trap site is not a designed one. Hence, the amount of charge traps and the trapping efficiency are difficult to tune to appropriate values for nonvolatile memory cells. In contrast, according to this embodiment, the amount of charge traps and the trapping efficiency can be appropriately adjusted.

Furthermore, the 4f-electron of these potentially tetravalent or divalent rare earth elements tends to be strongly localized. That is, it forms a localized level in the forbidden band and serves to prevent current leakage. Moreover, between such rare earth elements, superexchange interaction via the 2P-orbital of oxygen ($O^{2P}$) is likely to occur and increases the effective mass of the electron. This hinders the motion of electrons, and hence enhances the electron trapping effect, decreasing electrical conduction. That is, this embodiment prevents current leakage and improves retention characteristics.

Consequently, even if the block insulating film is thinned with the progress of downscaling, the required insulation performance can be achieved. Furthermore, even if the charge storage film is thinned with the progress of downscaling, the efficiency of trapping charges in the charge storage film can be prevented from decreasing at the write time.

In the following, the nonvolatile semiconductor memory device of this embodiment is described in more detail with reference to the manufacturing method therefor.

FIGS. 4 to 9 are process cross-sectional views illustrating a method for manufacturing the nonvolatile semiconductor memory device of this embodiment.

Figure 4:
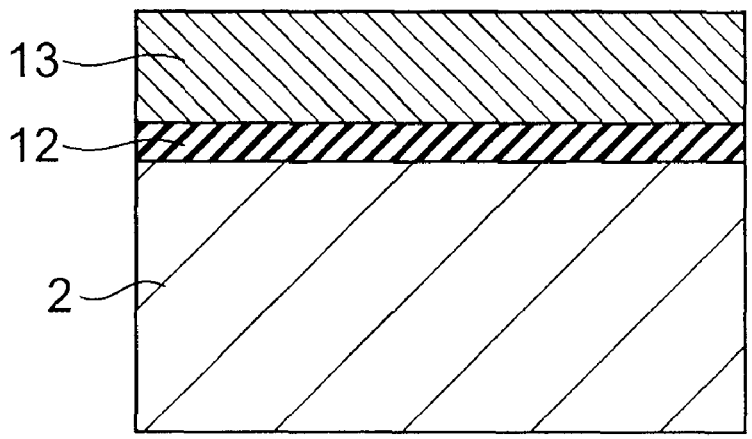

First, a laminated structure shown in FIG. 4 is formed. Specifically, the surface of a silicon substrate 2 with the silicon single crystal (001) plane being exposed is treated with dilute hydrofluoric acid to remove the natural oxide film. Subsequently, a tunnel insulating film 12 illustratively made of an $SiO_2$ film is formed 4 nm on the silicon substrate 2. The film formation technique can be thermal oxidation of the silicon substrate 2. The tunnel insulating film 12 is not limited to the $SiO_2$ film, but can be made of an SiON film. The SiON film can be obtained by oxidizing an SiN film formed by CVD (chemical vapor deposition), or by nitridizing an $SiO_2$ film.

Alternatively, the tunnel insulating film 12 can be a high dielectric film (high-k film) such as an HfSiON film, HfAlO film, and LaAlO film. The film formation method can be CVD or PVD (physical vapor deposition). After the tunnel insulating film 12 is formed, various heat treatments can be applied thereto. It is also possible to apply no heat treatment thereto.

Next, a charge storage film 13 made of a $PrAlO_3$ film with a thickness of 7 nm is formed on the tunnel insulating film 12. The film formation method can be based on sputtering, as well as CVD (chemical vapor deposition), MBE (molecular beam epitaxy), or PLD (pulsed laser deposition). In any of these film formation methods, industrially applicable film formation apparatuses are under development to respond to increasing wafer size.

In the case of sputtering, bulk targets can be prepared for praseodymium aluminate, terbium aluminate, cerium aluminate, ytterbium aluminate, and europium aluminate, and hence sputtering film formation based on such targets is available. Here, the above aluminates have the perovskite composition represented by the composition formula $LmAlO_3$ (where Lm is one or more of Pr, Tb, Ce, Yb, Eu, and Sm). However, perovskites are by nature likely to be deficient or excessive in oxygen, and such perovskite compositions can also be used.

Figure 5:
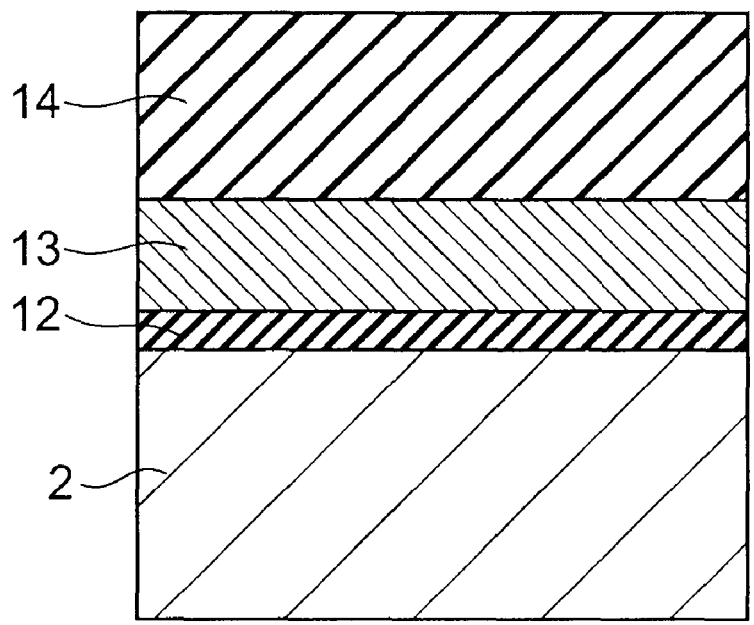

Next, as shown in FIG. 5, a lanthanum aluminate film added with a potentially tetravalent or divalent rare earth element is formed as a block insulating film 14 on the charge storage film 13.

The film formation method can be based on sputtering, as well as CVD, MBE, or PLD, like the formation of the charge storage film 13. Here, the lanthanum aluminate added with a potentially tetravalent or divalent rare earth element has the perovskite composition such as $La_{1-x}Ln_xAlO_3$ (where Ln is one or more of Pr, Tb, Ce, Yb, Eu, and Sm). With regard to oxygen, the above composition formula merely represents a stoichiometric amount based on approximation, and actually can be deficient or excessive in oxygen to some extent.

Figure 6B:
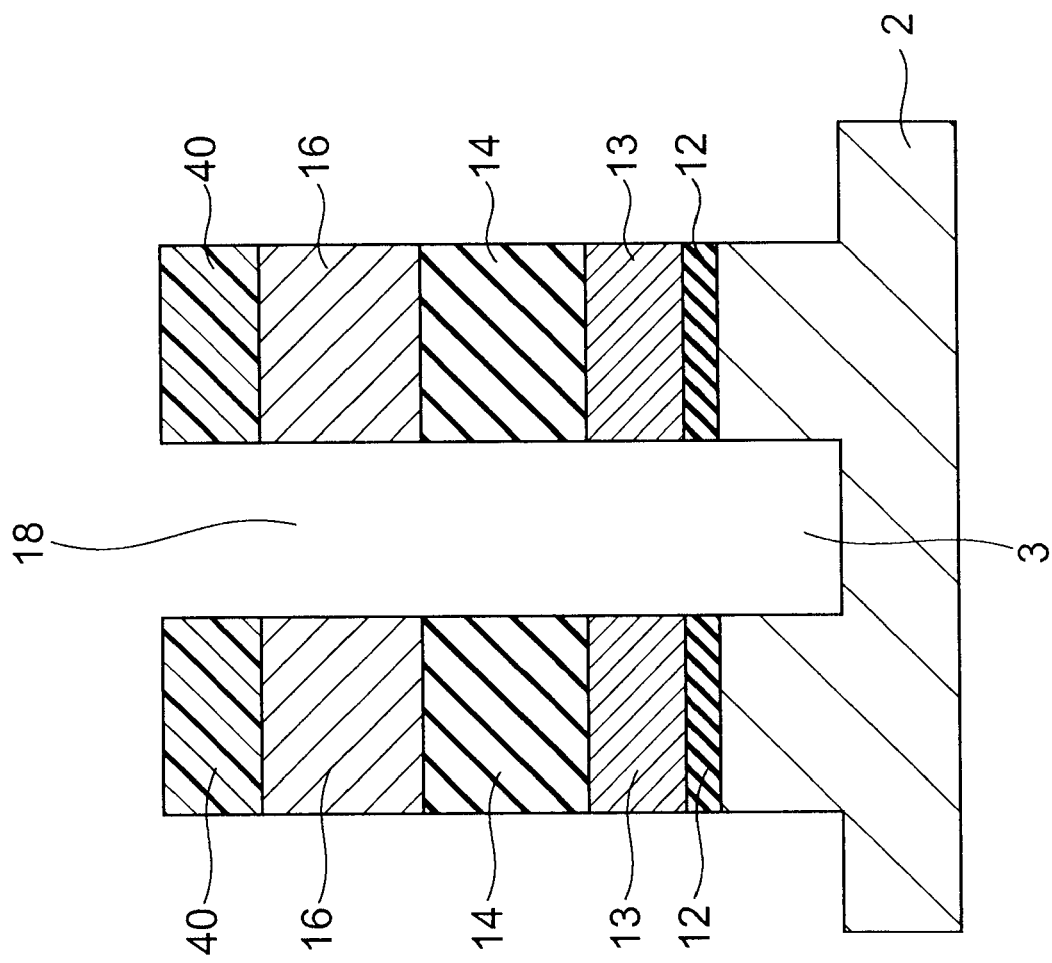
Figure 6A:
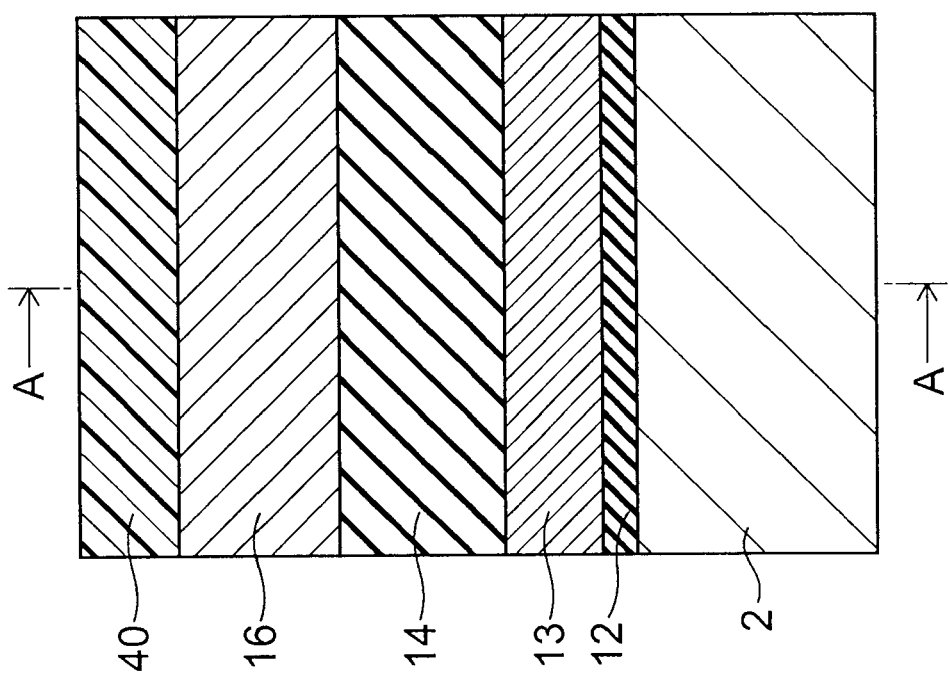

After the block insulating film 14 is formed, as shown in FIG. 6, a high melting point electrode film with a thickness of 100 nm is formed as a control gate electrode film 16. Furthermore, to produce a device isolation region on the high melting point electrode film 16, a mask material 40 illustratively made of $SiO_2$ is sequentially formed. Here, FIG. 6A is a cross-sectional view in the column direction, and FIG. 6B is a cross-sectional view in the row direction, taken along line A-A of FIG. 6A.

Then, a photoresist is applied onto the mask material 40 and subjected to exposure and development to form a resist pattern (not shown). By RIE (reactive ion etching), the resist pattern is used as a mask to pattern the mask material 40, and the resist pattern is transferred to the mask material 40. Then, the resist pattern is removed.

Subsequently, the mask material 40 is used as a mask to sequentially etch, by RIE, the high melting point electrode film 16, the block insulating film 14, the charge storage film 13, and the tunnel insulating film 12 to form a groove 18 for separating memory cells adjacent in the row direction. Then, RIE is used to etch the silicon substrate 2 to form therein a device isolation trench 3 having a depth of 100 nm.

Figure 7B:
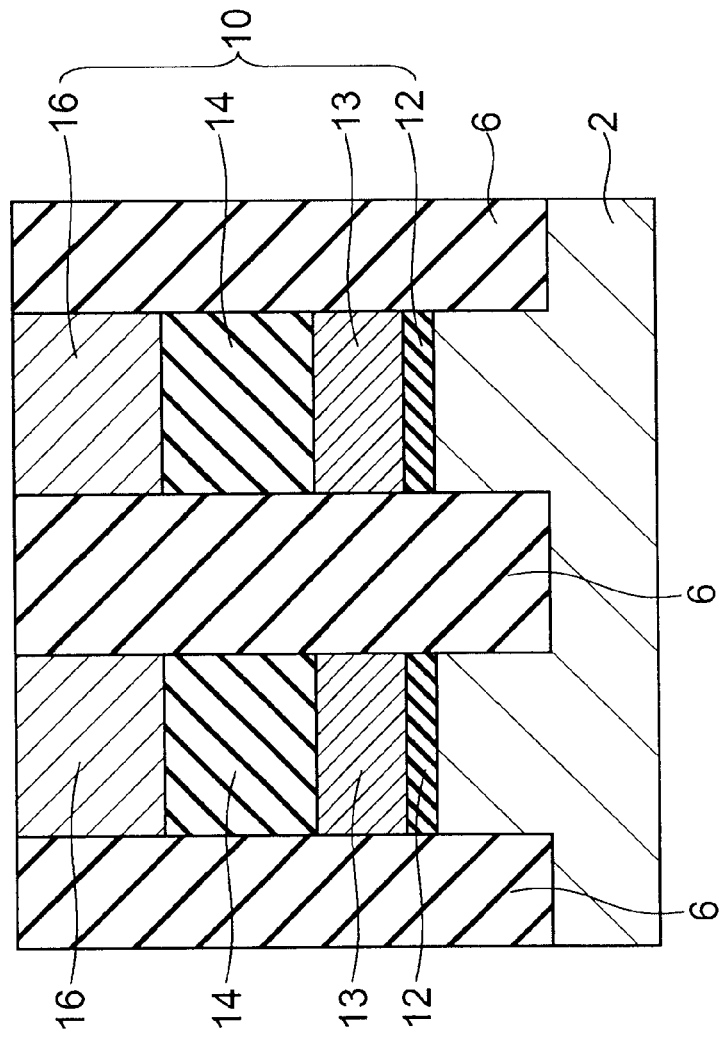
Figure 7A:
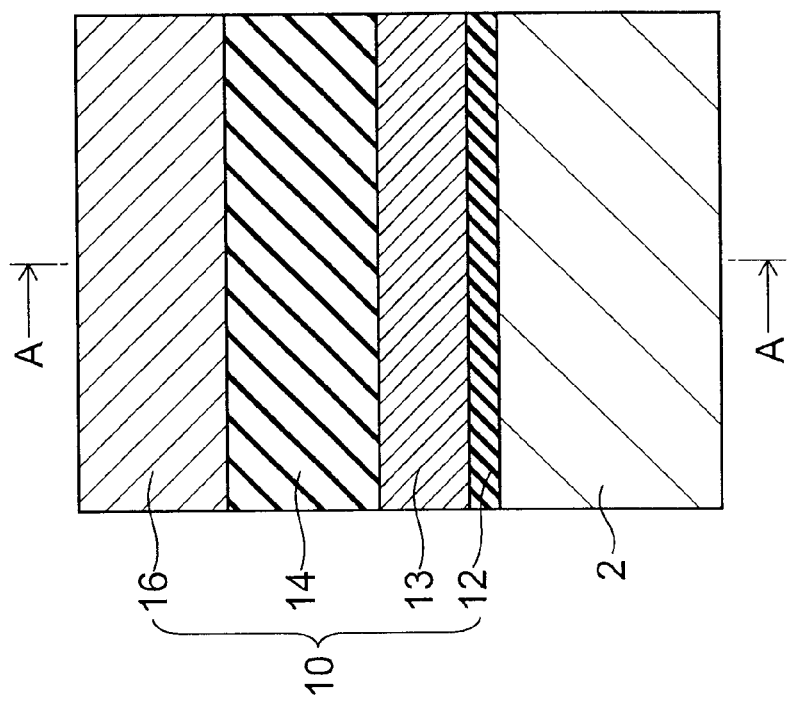

Next, as shown in FIG. 7, CVD is used to form a silicon oxide film (buried oxide film) 6 completely filling the groove 18 and the device isolation trench 3. Subsequently, the silicon oxide film 6 is polished by CMP (chemical mechanical polishing) until the mask material 40 is exposed to planarize the surface of the silicon oxide film 6. Then, the mask material 40 is selectively removed. Subsequently, the silicon oxide film 6 is etched back with dilute hydrofluoric acid solution so that the height of the silicon oxide film 6 is matched with the height of the phosphorus-doped polycrystalline silicon film 16. Here, FIG. 7A is a cross-sectional view in the column direction, and FIG. 7B is a cross-sectional view in the row direction, taken along line A-A of FIG. 7A.

Next, as shown in FIG. 8, a conductive film illustratively made of tungsten with a thickness of 100 nm is formed by CVD as a word line 17 on the high melting point electrode film 16. Here, FIG. 8A is a cross-sectional view in the column direction, and FIG. 8B is a cross-sectional view in the row direction, taken along line A-A of FIG. 8A.

Next, as shown in FIG. 9, a mask material 42 illustratively made of $SiO_2$ is formed on the conductive film 17 by CVD. Then, a photoresist is formed on the mask material 42 and subjected to exposure and development to form a resist pattern (not shown). Subsequently, by RIE, the resist pattern is used as a mask to pattern the mask material 42, and thereby the resist pattern is transferred to the mask material 42. Then, the resist pattern is removed.

Subsequently, the mask material 42 is used as a mask to sequentially etch, by RIE, the conductive film 17, the high melting point electrode film 16, the block insulating film 14, the charge storage film 13, and the tunnel insulating film 12 to form a MONOS gate 10. Here, FIG. 9A is a cross-sectional view in the column direction, and FIG. 9B is a cross-sectional view in the row direction, taken along line A-A of FIG. 9A.

Subsequently, after the mask material 42 is removed, a silicon oxide film 22 is formed at least on the side surface of the MONOS gate 10 by CVD. In this embodiment, the silicon oxide film 22 is formed also on the side surface and the upper surface of the conductive film 17 (see FIGS. 1 and 2). Then, by ion implantation, an $n^+$-type source-drain diffusion regions 4a, 4b are formed in the surface region of the silicon substrate 2 in a self-aligned manner to complete a memory cell. Subsequently, an interlayer insulating film 24 covering the memory cell is formed by CVD (see FIGS. 1 and 2).

Thus, it is possible to form the basic structure of a NAND-type MONOS flash memory cell used for a large-capacity nonvolatile semiconductor memory device.

$TbAlO_3$, which can be used as a charge storage film 13 or a block insulating film 14 in this embodiment, is colorless and transparent if it is produced in a reducing atmosphere, but black if it is produced in an inert gas atmosphere (Masami Sekita, Yasuto Miyazawa, Shoji Morita, Hideyuki Sekiwa, and Yoichiro Sato, Appl. Phys. Lett. 65 (19), 7 Nov. 1994). Such difference is attributable primarily to the deviation of the amount of oxygen from the stoichiometric ratio. The interband transition or bandgap corresponding to the peak with saturated intensity around a wavelength of 270 nm is 4.60 eV. The broad peak with maximum intensity around 450 nm, which occurs by comparison between the reducing atmosphere sample A and the inert gas atmosphere sample B, is attributed to $Tb^{4+}$, and has an energy depth of 2.76 eV, indicating that it produces a deep level. That is, the $Tb^{4+}$ site acts as a charge trapping site. $TbAlO_3$ serving as a charge storage film has the advantage of good retention characteristics achieved by deep trap levels. $La_{1-x}Tb_xAlO_{3+\delta}$ serving as a block insulating film has the effect of reducing leakage current achieved by the large effective mass of the electron, as well as the advantage of further reducing leakage current achieved by the superposition of the Coulomb blockade effect by charges trapped in the deep level.

$TbAlO_3$, if used alone, has an excessively high density of charge traps, which produce the effect of reducing leakage current in the block insulating film 14 of a MONOS flash memory. Hence, in this embodiment, Tb is added in the form of replacing La in $LaAlO_3$. The amount of added Tb is preferably such that the added Tb ions do not result in forming a percolation path with each other. The amount of avoiding a percolation path, which otherwise acts as a leakage path of electrons, can be approximated to the amount at which the added Tb ions are not adjacent to each other. For a perovskite A-site in lanthanum aluminate, the number of nearest neighbor A-sites is six. Hence, it is preferable that Tb ions occupy less than one of them, i.e., its ratio be less than $\frac{1}{6}=0.167$. That is, the preferable composition is $(La_{1-x}Tb_x)_{2-y}A_yIO_{3+\delta}$ where the amount of addition, x, is in the range of $0<x<0.292$, $0.95 \leq y \leq 1.20$, and $0 \leq \delta \leq 3x(2-y)/14$.

On further consideration, trivalent and tetravalent Tb exist in the proportion of 4:3, as can be seen from the fact that the most stable Tb oxide is $Tb_7O_{12}$, i.e., $Tb_7O_{12}=2Tb_2O_3+3TbO_2$. Because percolation causes concern only for tetravalent Tb, the upper bound of the amount of addition, x, is expanded a little to $0.167 \times 7/4 = 0.292$, therefore the addition of $(La_{1-x}Tb_x)_{2-y}Al_yO_{3+\delta}$ has the expanded range of $0<x<0.292$, $0.95 \leq y \leq 1.20$, and $0 \leq \delta < 3x(2-y)/14$.

Pure lanthanum aluminate without added Tb can be also used as the block insulating film of a MONOS flash memory. However, in this embodiment, the insulation performance of the block insulating film can be further enhanced by addition of Tb. With further progress of downscaling, the block insulating film also requires higher insulation performance. According to this embodiment, such requirement can be satisfied at least for two generations.

On the other hand, the charge storage film 13 adjacent to the $La_{1-x}Tb_xAlO_{3+\delta}$ block insulating film 14 can be also made of $TbAlO_3$ to serve as the charge storage film of a MONOS flash memory having higher trap density than those based on $SiN_x$ and the like.

In actual film formation, whether an oxidizing or reducing atmosphere is used can be controlled by adjusting the amount of oxygen added to the sputtering atmosphere, for example, in the case of sputtering film formation. Furthermore, a practical device is covered with a protection film. Hence, once the device is produced, the change of redox state seriously affecting the electrical performance can be easily prevented for ten years in which the operation of the flash memory is guaranteed by the specification.

In this embodiment, in the case where the block insulating film 14 made of $La_{1-x}Tb_xAlO_{3+\delta}$ and the charge storage film 13 made of $TbAlO_3$ are used in combination, diffusion of rare earth elements, if any, in heat treatment at 800° C. or higher needed for LSI processing can be addressed by film formation methods using an initial concentration allowing for the diffusion of rare earth elements.

As described above, the rare earth aluminate used in this embodiment has a perovskite composition in which the molar ratio between the rare earth element and aluminum is 1:1. However, any deviation from the composition ratio of 1:1 in the range of approximately ±0.05, which can be quantitatively determined in practical composition analysis techniques, is encompassed within the scope of the invention. The perovskite composition has a large intracrystalline space around the perovskite B-site ion, and the significant contribution of the polarization of B-site ions increases the relative dielectric constant. That is, for the same equivalent oxide thickness, the actual film thickness can be increased. Hence, the mechanism of reducing leakage current increases the performance to be achieved by the block insulating film. Furthermore, in a composition richer in aluminum than the above perovskite composition, the bandgap expands almost linearly in accordance with the fact that the bandgap of alumina is approximately 8.8 eV, which is larger than the bandgap of lanthanum aluminate, 5.7 eV. Hence, the condition of low leakage current is maintained up to 0.80:1.20. Aluminum composition beyond 0.80:1.20 causes concern about increased leakage current corresponding to the fact that the relative dielectric constant of alumina is approximately 8, which is lower than the relative dielectric constant of lanthanum aluminate, 23. The deviation of the amount of oxygen in rare earth aluminates also exists in the same manner as described above, and such deviation can also be used in this embodiment.

For example, JP-A 2006-203200 (Kokai) discloses use of $((Hf, Zr, Y, or Ln)O_2)_x(Al_2O_3)_{1-x}$ ($0.03 \leq x \leq 0.26$) as a tunnel oxide layer or a blocking oxide layer, where Ln is La, Ce, Pr, Nd, Pm, Sm, Eu, Gd, Tb, Dy, Ho, Er, Tm, Yb, or Lu. To express this composition another way for easy comparison with this embodiment, the molar composition ratio between the rare earth element and aluminum is in the range from 0.03:1.94 to 0.26:1.48. That is, this is clearly different from the molar composition ratio between the rare earth element and aluminum in this embodiment.

Second Embodiment

Instead of Tb (terbium) used for at least one of the charge storage film 13 and the block insulating film 14 in the first embodiment, Pr (praseodymium) can also be used. Like terbium, praseodymium is also a potentially tetravalent rare earth element, and produces $Pr^{4+}$ in a moderately oxidizing atmosphere to form a deep localized level like terbium. Like terbium aluminate, praseodymium aluminate also has a phase of the perovskite composition, forming a green transparent crystal in an oxidizing atmosphere. Although the accurate depth of the impurity level is not definitely determined, it is considered to be located around 2.3 eV in view of absorption of green light at approximately 530 nm. Because praseodymium aluminate also has a bandgap around 5.0 eV, it has almost the same band structure as terbium aluminate.

$Pr_6O_{11}$, which is the most stable Pr oxides, can be represented as $Pr_6O_{11}=Pr_2O_3+4PrO_2$. Thus, trivalent and tetravalent Pr exist in the proportion of 1:2. Hence, from the viewpoint of preventing formation of percolation paths, it turns out that the upper bound of added Pr in $(La_{1-x}Pr_x)_{2-y}Al_yO_{3+\delta}$ is expanded to 0.167×2/1=0.333, therefore the addition of $(La_{1-x}Pr_x)_{2-y}Al_yO_{3+\delta}$ has the expanded range of $0<x<0.333$, $0.95 \leq y \leq 1.20$, and $0 \leq \delta \leq x(2-y)/3$.

Praseodymium aluminate is magnetically ordered at low temperatures below 151 K, and is paramagnetic at room temperature, where magnetic moments at approximately 3.6 µB participate in the negative superexchange interaction via oxygen (E. Cohen, L. A. Risberg, W. A. Nordland, R. D. Burbank, R. C. Sherwood, and L. G. Van Uitert, Physical Review 186, 476 (1969)). Because the substance of magnetic moment is an electron, the above fact means a large interaction between electrons, and that the effective mass of the electron is increased by the effect of dragging the surrounding electrons. That is, praseodymium aluminate used as a charge storage film is expected to have high trapping efficiency because of the increase of electron scattering cross section, and high retention characteristics because the electron, once trapped, is difficult to move. Its addition to lanthanum aluminate for use as a block insulating film is expected to reduce leakage current because the heavy electron is difficult to move, and because of the superposition of the Coulomb blockade effect by charges in the designed trap sites.

The similar effect is also anticipated for terbium aluminate.

Third Embodiment

Instead of terbium and praseodymium used for at least one of the charge storage film 13 and the block insulating film 14 in the first and second embodiment, Ce (cerium) can also be used.

Cerium aluminate is stable when the cerium ion is tetravalent. Hence, if used alone, at high temperatures, cerium aluminate may be thermally decomposed into ceria and alumina by elimination of oxygen. However, in the case where it is used as the charge storage film 13 of a MONOS flash memory, oxygen elimination is prevented because it is capped with the overlying $La_{1-x}Ce_xAlO_{3+\delta}$ ($0<x<0.167$, $0 \leq \delta \leq x/2$) block insulating film 14 and the protection films 22, 24. Thus, the charge storage film 13 is expected to maintain its function without thermal decomposition.

Furthermore, the block insulating film 14 made of a mixed crystal of $La_{1-x}Ce_xAlO_{3+\delta}$ ($0<x<0.167$, $0 \leq \delta \leq x/2$) with lanthanum aluminate has a higher stability because it is a mixed crystal in addition to being capped with electrodes and protection films. Thus, like terbium and praseodymium described above, such a mixed crystal can be used as a MONOS block insulating film 14. Cerium aluminate has a relative dielectric constant of over 200, and hence has a significant effect of reducing leakage current when it is added to the block insulating film. Furthermore, because of its relative dielectric constant over 200, cerium aluminate used as a charge storage film has a significant effect of shielding stored charges, advantageously allowing a larger amount of charges to be stored.

Fourth Embodiment

Instead of terbium, praseodymium, and cerium used for at least one of the charge storage film 13 and the block insulating film 14 in the first to third embodiment, a potentially divalent rare earth element such as Yb (ytterbium) and Eu (europium) can also be used.

As opposed to terbium, praseodymium, and cerium, by film formation in a reducing atmosphere, ytterbium, europium, and samarium produce $Yb^{2+}$, $Eu^{2+}$, and $Sm^{2+}$, which can serve as charge trap sites. That is, these elements capture an electron when they transition from the trivalent state to the divalent state. It is noted that, like terbium, praseodymium, and cerium described above, capping with a protection film is desirable.

Example 1

A silicon substrate is treated with dilute hydrofluoric acid to remove the natural oxide film and the like. Then, a tunnel insulating film 12 made of $SiO_2$ or $SiO_xN_y$ is formed 5 nm. A charge storage film made of SiN is formed 5 nm on the tunnel insulating film 12. A block insulating film 14 made of $(La_{1-x}$ $Ln_x)_{2-y}Al_yO_{3+\delta}$ (where Ln is one or more of Pr, Tb, Ce, Yb, Eu, and Sm, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb)); is formed 15 nm on the charge storage film. An electrode 16 made of TaN is formed on the block insulating film 14. In this configuration, because the $(La_{1-x}Ln_x)_{2-y}Al_yO_{3+\delta}$ block insulating film 14 has higher electrical insulation performance than the LaAlO$_3$ block insulating film, the charge retention characteristics can be improved, and the applied voltage for charge storage and erasure can be decreased. Here, Pr, Tb, and Ce used as Ln are particularly superior. Yb and Eu also achieve good results.

Example 2A

A silicon substrate is treated with dilute hydrofluoric acid to remove the natural oxide film and the like. Then, a tunnel insulating film 12 made of SiO$_2$ or SiO$_x$N$_y$ is formed 5 nm. A charge storage film 13 made of $Lm_{2-z}Al_zO_{3+\in}$ (where Lm is one or more of Pr, Tb, Ce, Yb, Eu, and Sm, $0.95 \leq z \leq 1.20$, and $0 \leq \in \leq (2-z)/2$ (but $-(2-z)/2 \leq \in \leq 0$ if Lm is Yb, Eu, and Sm, $0 \leq \in \leq (2-z)/3$ if Lm is Pr, and $0 \leq \in \leq 3(2-z)/14$ if Lm is Tb)) is formed 12 nm on the tunnel insulating film 12. A block insulating film made of Al$_2$O$_3$ is formed 7 nm on the charge storage film 13. An electrode 16 made of Ta(O)N is formed on the block insulating film. Here, Ta(O)N refers to a TaN film allowing oxygen to be mixed therein in the range of 10% or less. In this configuration, because the $Lm_{2-z}Al_zO_{3+\in}$ charge storage film 13 is superior in trapping characteristics to the charge storage film made of SiN, the charge writing characteristics, charge retention characteristics, and charge erasure characteristics can be improved.

Example 2B

An electrode made of TaN or Ta(O)N is used in Examples 1 and 2A. However, an electrode made of Ta(O)C can also be used. TaN, Ta(O)N, and Ta(O)C are similar in high melting point and low reactivity.

Fifth Embodiment

The block insulating film 14 in the first to fourth embodiment can also be made of $(Rm_{1-x}Ln_x)_{2-y}Al_yO_{3+\delta}$ (where Ln is one or more of Pr, Tb, Ce, Yb, Eu, and Sm, Rm is one or more of La, Nd, Gd, Dy, Ho, Er, Tm, Lu, Y, and Sc, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb)). However, it is most preferable that the element Rm be La. This is because the relative dielectric constant of $(Rm_{1-x}Ln_x)_{2-y}Al_yO_{4+\delta}$ successively decreases in the order of La, Nd, Gd, Dy, Ho, Er, Tm, Lu, Y, and Sc for the element Rm, and hence the relative dielectric constant is maximized in the case of using La, realizing a block insulating film with low leakage current. However, any of the above elements can be used for the element Rm because it does not decrease the relative dielectric constant so substantially as to impair the usefulness of this embodiment.

Example 2C

MONOS nonvolatile memories have been originally used as NOR flash memories. In contrast, this embodiment is advantageously applicable to various memory cells irrespective of the type of peripheral circuits, including the NAND type, the NOR type, or other less popular structures such as the DINOR type, the 3Tr-NAND type with one memory cell sandwiched between two select transistors, and the D-type NAND cell with no source/drain diffusion layer.

Example 3

A silicon substrate is treated with dilute hydrofluoric acid to remove the natural oxide film and the like. Then, a tunnel insulating film 12 made of SiO$_2$ or SiO$_x$N$_y$ is formed 5 nm. A charge storage film made of polycrystalline Si is formed 5 nm on the tunnel insulating film 12. An interpoly insulating film (block insulating film) 14 made of $(La_{1-x}Ln_x)_{2-y}Al_yO_{3+\delta}$ (where Ln is one or more of Pr, Tb, Ce, Yb, Eu, and Sm, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb)) is formed 15 nm on the charge storage film. An electrode 16 made of polycrystalline Si is formed on the interpoly insulating film 14. This polycrystalline Si is highly doped with phosphorus or the like to decrease its electrical resistance. In this configuration, because the $(La_{1-x}Ln_x)_{2-y}Al_yO_{3+\delta}$ interpoly insulating film 14 has higher electrical insulation performance than the block insulating film made of LaAlO$_3$, the charge retention characteristics can be improved, and the applied voltage for charge storage and erasure can be decreased.

The embodiments of the invention have been described with reference to specific examples. However, the invention is not limited to the above specific examples. For instance, any two or more of the specific examples described above with reference to the first to fifth embodiments and examples 1 to 3 can be combined with each other as long as technically feasible, and such combinations are also encompassed within the scope of the invention.

Furthermore, the invention can be variously modified and practiced without departing from the spirit of the invention, and such modifications are all encompassed within the scope of the invention.

The invention claimed is:

1. A nonvolatile semiconductor memory device comprising:
   a source region and a drain region spaced from each other in a surface of a semiconductor layer;
   a tunnel insulating film provided on the semiconductor layer between the source region and the drain region;
   a charge storage film provided on the tunnel insulating film;
   a block insulating film provided on the charge storage film and made of $(Rm_{1-x}Ln_x)_{2-y}Al_yO_{3+\delta}$, where Ln is one or more selected from Pr, Tb, Ce, Yb, Eu, and Sm, Rm is one or more selected from La, Nd, Gd, Dy, Ho, Er, Tm, Lu, Y, and Sc, $0<x<0.167$ (but $0<x<0.333$ if Ln is Pr, and $0<x<0.292$ if Ln is Tb), $0.95 \leq y \leq 1.20$, and $0 \leq \delta \leq x(2-y)/2$ (but $-x(2-y)/2 \leq \delta \leq 0$ if Ln is Yb, Eu, and Sm, $0 \leq \delta \leq x(2-y)/3$ if Ln is Pr, and $0 \leq \delta \leq 3x(2-y)/14$ if Ln is Tb); and
   a control gate electrode provided on the block insulating film.

2. The memory device according to claim 1, wherein the charge storage film is made of $Lm_{2-z}Al_zO_{3+\in}$, where Lm is one or more selected from Pr, Tb, Ce, Yb, Eu, and Sm, $0.95 \leq z \leq 1.20$, and $0 \leq \in \leq (2-z)/2$ (but $-(2-z)/2 \leq \in \leq 0$ if Lm is Yb, Eu, and Sm, $0 \leq \in \leq (2-z)/3$ if Lm is Pr, and $0 \leq \in \leq 3(2-z)/14$ if Lm is Tb).

3. The memory device according to claim 2, wherein the Lm is Tb, and at least some of the Tb form a tetravalent ion.

4. The memory device according to claim 2, wherein the Lm is Pr, and at least some of the Pr form a tetravalent ion.

5. The memory device according to claim 1, wherein the Rm is La.

6. The memory device according to claim 1, wherein the Ln is one or more selected from Pr, Tb, and Ce.

7. The memory device according to claim 1, wherein the Rm is La, and the Ln is Tb.

8. The memory device according to claim 7, wherein at least some of the Tb form a tetravalent ion.

9. The memory device according to claim 1, wherein the Rm is La, and the Ln is Pr.

10. The memory device according to claim 9, wherein at least some of the Pr form a tetravalent ion.

11. The memory device according to claim 1, wherein the Rm is La, and the Ln is Ce.

12. The memory device according to claim 1, wherein the Rm is La, and the Ln is Yb.

13. The memory device according to claim 1, wherein the Rm is La, and the Ln is Eu.

14. The memory device according to claim 1, wherein the Rm is La, and the Ln is Sm.

15. A nonvolatile semiconductor memory device comprising:
   a source region and a drain region spaced from each other in a surface of a semiconductor layer;
   a tunnel insulating film provided on the semiconductor layer between the source region and the drain region;
   a charge storage film provided on the tunnel insulating film and made of $Lm_{2-z}Al_zO_{3+\epsilon}$, where Lm is one or more selected from Pr, Tb, Ce, Yb, Eu, and Sm, $0.95 \leq z \leq 1.20$, and $0 \leq \epsilon \leq (2-z)/2$ (but $-(2-z)/2 \leq \epsilon \leq 0$ if Lm is Yb, Eu, and Sm, $0 \leq \epsilon \leq (2-z)/3$ if Lm is Pr, and $0 \leq \epsilon \leq 3(2-z)/14$ if Lm is Tb);
   a block insulating film provided on the charge storage film; and
   a control gate electrode provided on the block insulating film.

16. The memory device according to claim 15, wherein the Lm is one or more selected from Pr, Tb, and Ce.

17. The memory device according to claim 15, wherein the Lm is Tb.

18. The memory device according to claim 17, wherein at least some of the Tb form a tetravalent ion.

19. The memory device according to claim 17, wherein the block insulating film is made of $(La_{1-x}Tb_x)_{2-y}Al_yO_{3+\delta}$, where $0 < x < 0.292$, $0.95 \leq y \leq 1.20$, and $0 \leq \delta \leq 3x(2-y)/14$.

20. The memory device according to claim 15, wherein the Lm is Pr.

21. The memory device according to claim 20, wherein at least some of the Pr form a tetravalent ion.

* * * * *